United States Patent
Saccomanno et al.

(10) Patent No.: US 12,081,226 B2
(45) Date of Patent: Sep. 3, 2024

(54) FEED-FORWARD IN TRACKING ANALOG-TO-DIGITAL CONVERTER

(71) Applicant: Apple Inc., Cupertino, CA (US)

(72) Inventors: Giovanni Saccomanno, Munich (DE); Alberto Celin, Munich (DE); Fabio Busignani, Munich (DE); Siarhei Meliukh, Munich (DE)

(73) Assignee: Apple Inc., Cupertino, CA (US)

( * ) Notice: Subject to any disclaimer, the term of this patent is extended or adjusted under 35 U.S.C. 154(b) by 95 days.

(21) Appl. No.: 17/931,065

(22) Filed: Sep. 9, 2022

(65) Prior Publication Data

US 2024/0088909 A1   Mar. 14, 2024

(51) Int. Cl.
*H03M 1/18*   (2006.01)
*H03M 1/00*   (2006.01)
*H03M 1/10*   (2006.01)
*H03M 1/34*   (2006.01)

(52) U.S. Cl.
CPC ........... *H03M 1/181* (2013.01); *H03M 1/001* (2013.01); *H03M 1/1071* (2013.01); *H03M 1/34* (2013.01)

(58) Field of Classification Search
CPC .... H03M 1/181; H03M 1/001; H03M 1/1071; H03M 1/34

USPC ......................................... 341/126, 139, 143
See application file for complete search history.

(56) References Cited

U.S. PATENT DOCUMENTS

| | | | |
|---|---|---|---|
| 4,633,720 A | 1/1987 | Dybel et al. | |
| 7,382,309 B2 * | 6/2008 | Kim | H03M 1/48 341/155 |
| 8,358,231 B2 * | 1/2013 | Killat | H03M 1/125 341/166 |
| 9,419,611 B2 | 8/2016 | Motz | |
| 10,770,983 B2 | 9/2020 | Sen et al. | |

* cited by examiner

*Primary Examiner* — Khai M Nguyen
(74) *Attorney, Agent, or Firm* — Kowert, Hood, Munyon, Rankin & Goetzel, P.C.; Dean M. Munyon

(57) ABSTRACT

A tracking ADC with a feed-forward loop is disclosed. The tracking ADC includes a feedback circuit configured to generate a feedback signal using an input voltage and a comparison circuit configured to sample, using a plurality of threshold values, the feedback signal to generate a plurality of samples. A counter circuit is configured to update a count value using a subset of the plurality of samples. A digital-to-analog converter (DAC) circuit configured to generate a control signal using the count value. The feedback circuit is further configured to modify the feedback signal using the control signal and at least one of the plurality of samples. By modifying the feedback voltage, the settling time may be reduced, allowing the ADC to be run at a higher clock speed.

20 Claims, 7 Drawing Sheets

FEED-FORWARD IN TRACKING ANALOG-TO-DIGITAL CONVERTER

BACKGROUND

Technical Field

This disclosure is directed to electronic circuits, and more particularly, circuits for converting analog signals into digital signals.

Description of the Related Art

In many electronic systems, signals may be converted from an analog format into a digital format, and vice versa. Accordingly, a wide variety for conversion circuits have been designed and implemented for performing this task. One example application of an analog-to-digital converter (ADC) is the conversion of an analog signal representative of sound received by a microphone into a digital format, where it can be utilized as digital audio. During playback, the digital audio signals may be converted back into analog signals that are subsequently provided to a speaker.

One type of ADC is known as a tracking ADC, which may be used in applications such as the monitoring of a supply voltage. Tracking ADCs typically include a comparator that compares the input signal to a reference voltage. The output of the comparator is provided to a counter, which increments or decrements the count by one least significant bit (LSB) value each clock cycle. The conversion value is the digital value of the counter.

SUMMARY

A tracking ADC with a feed-forward loop is disclosed. In one embodiment, a tracking ADC includes a feedback circuit configured to generate a feedback signal using an input voltage and a comparison circuit configured to sample, using a plurality of threshold values, the feedback signal to generate a plurality of samples. A counter circuit is configured to update a count value using a subset of the plurality of samples. A digital-to-analog converter (DAC) circuit configured to generate a control signal using the count value. The feedback circuit is further configured to modify the feedback signal using the control signal and at least one of the plurality of samples.

In one embodiment, the feedback circuit includes a resistor coupled to receive, on one terminal, the input voltage in order to generate the feedback signal on the other terminal. The feedback circuit may also include first and second current sources that may be activated in response to a comparison signal asserted by the comparison circuit. The comparison circuit may assert a first comparison signal, thereby causing activation of a first current source, in response to a voltage of the feedback signal being greater than a first threshold. The comparison circuit may assert a second comparison signal in response to determining that the voltage of the feedback signal is less than a second threshold, the second threshold being less than the first threshold. A second current source may be deactivated in response to assertion of the second comparison signal. Activation of the first current source and deactivation of the second current source may effectively anticipate the next counter value and thus aid in the settling of the feedback voltage. After the counter has calculated the next value and provided it to the DAC during a given clock cycle (allowing sufficient time for settling of the feedback voltage), an active one of the first and second current sources may be deactivated until the next clock cycle. It is noted that if the voltage of the feedback signal is less than the first (upper) threshold and greater than the second (lower) threshold, neither of the current sources are activated.

BRIEF DESCRIPTION OF THE DRAWINGS

The following detailed description makes reference to the accompanying drawings, which are now briefly described.

DETAILED DESCRIPTION OF EMBODIMENTS

Figure 1:
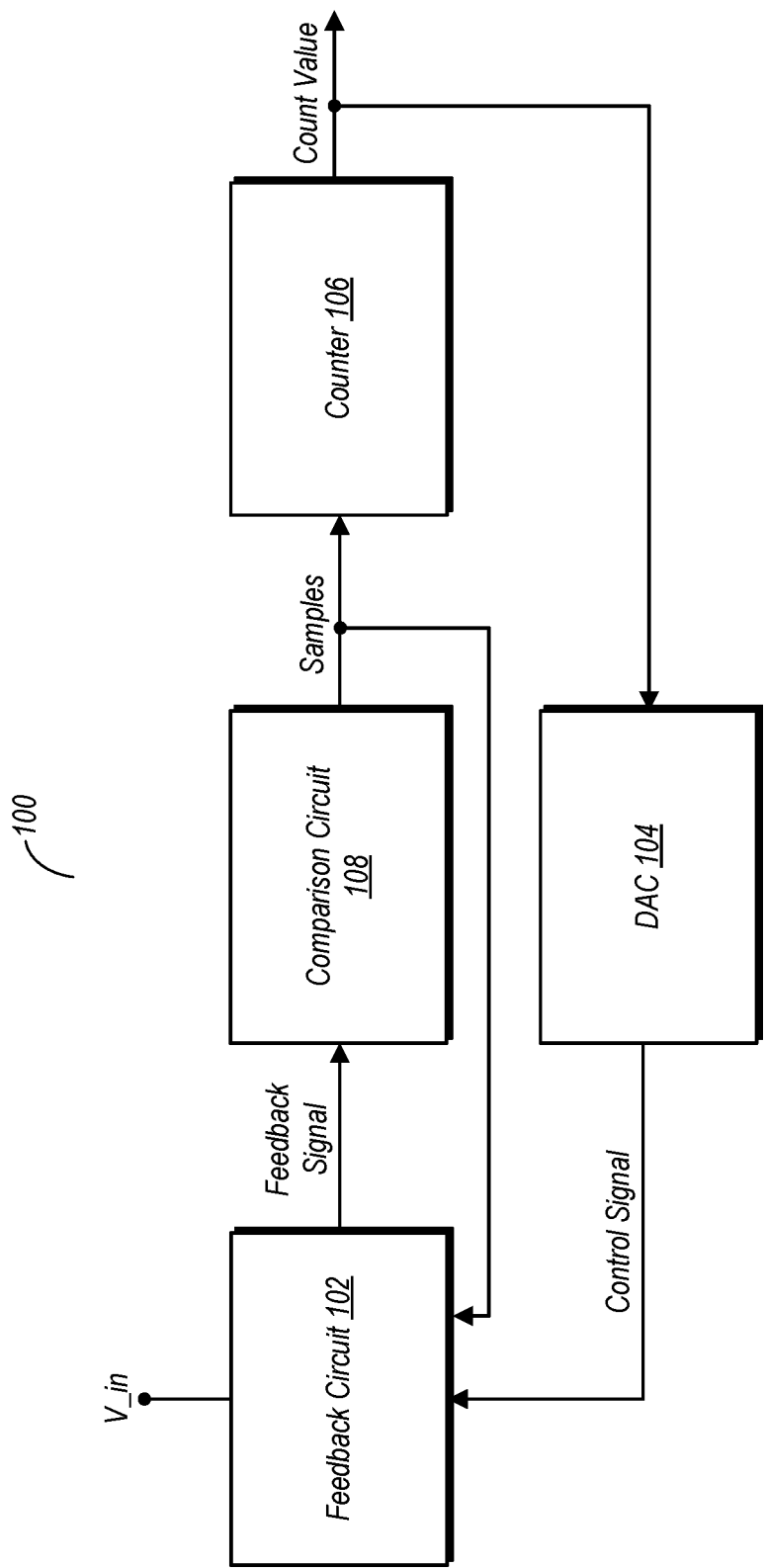
FIG. 1 is a block diagram of one embodiment of a tracking ADC.

Tracking ADCs have a wide variety of uses. For example, tracking ADCs may be used to track and monitor a supply voltage provided by a power supply. A tracking ADC includes one or more comparators that feed a counter, which can increment or decrement by one LSB each clock cycle. The digital output of the counter is fed back to a DAC, which along with a feedback resistor coupled to an input source, generates a feedback voltage, which is compared to one or more reference voltages (depending on the number of comparators). However, the feedback resistor, along with parasitic capacitance, form an unintended RC filter. This in turn requires some settling time for the feedback voltage. If the setting is too slow, it can either limit the speed of the tracking ADC, or create inaccuracies if it is running too fast. Furthermore, since it is a closed loop system, instability can be introduced into the ADC.

The present disclosure makes use of the insight that, if the next value of the ADC could be anticipated, the counter value could be updated while modifying the feedback voltage to affect the settling time. Accordingly, the ADC could be run at a higher clock speed.

Accordingly, the present disclosure is directed to a tracking ADC that uses compensation in a feed forward manner to compensate a feedback voltage. Based on the operation of a comparator circuit that feeds the counter of the ADC (thus causing it to increment or decrement), the feedback signal is modified by an amount that is substantially equal to the analog equivalent of one LSB (least significant bit). This may be carried out by a current source.

In a two comparator embodiment, one comparator, referred to as the up comparator, may trigger a comparison signal if the feedback voltage exceeds a first threshold value (thereby anticipating that the counter will increment). A first current source coupled to the feedback voltage node may be turned on, thereby modifying the feedback voltage downward by one LSB. If the feedback voltage is less than a second threshold value (thereby anticipating the ADC will decrement), a second current source may be deactivated, thereby modifying the feedback voltage upward by one LSB. If neither of the comparators triggers, the feedback voltage is not modified and the count is maintained until the next cycle.

As a result of this arrangement, the tracking ADC may be operated at a higher clock frequency without being limited by the dynamic error that would otherwise result from the voltage settling time. In applications such as voltage supply monitoring, this can enable more timely responses to various events, such as overvoltage or undervoltage detections.

The present disclosure will now discuss various embodiments of a tracking ADC and potential uses thereof further. The discussion begins with embodiments of a tracking ADC, with a timing diagram illustrating operation of one such embodiment. An example use case of a tracking ADC as a voltage monitor is then described. Methods of operating various embodiments of a tracking ADC are then discussed, with the disclosure concluding with a description of an example system.

Tracking ADC Embodiments:

FIG. 1 is a block diagram of one embodiment of a tracking ADC. In the embodiment shown, tracking ADC 100 includes a feedback circuit 102, a comparison circuit 108, a counter circuit 106, and a digital-to-analog converter (DAC) 104.

Comparison circuit 108 in the embodiment shown is configured to generate the samples by comparing a voltage level of the feedback signal to one or more thresholds. In one embodiment, comparison circuit 108 may include a single comparator that generates a comparison signal (and thus, a sample) based on whether the voltage of the feedback signal is greater than or less than a particular threshold, and thus determine whether the counter circuit 106 is to increment or decrement a count value based on the current sample. In another embodiment, a voltage of the feedback signal may be compared to two different thresholds, with the resultant samples determining whether counter circuit 106 is to increment, decrement, or maintain the count value.

Feedback circuit 102 in the embodiment shown is coupled to receive an input voltage, V_in, and is configured to generate a feedback signal based on the input voltage, samples provided from comparison circuit 108 and a control signal provided by DAC 104. The control signal, generated by DAC 104 based on the current count value, may allow feedback circuit 102 to provide coarse control of the feedback signal voltage. Fine control of the feedback signal voltage may be provided within feedback circuit 102 by various circuits that allow fine grain adjustment thereto. In one embodiment, feedback circuit 102 may adjust the voltage of the feedback signal up or down by a value equivalent to one least significant bit (LSB) of the counter, based on samples received from comparison circuit 108. Since the samples may be generated before counter circuit 106 updates the count value, the modification of the feedback voltage by feedback circuit 102 may effectively anticipate the next count value. Furthermore, the fine grain modification to the voltage of the feedback signal may be provided for time period that would be sufficient to allow the feedback voltage to settle, due to an inherent RC filter therein, were the voltage not modified. Thus, the feedback voltage may be set to a level that is substantially the same as its final, settled value, without delay. This in turn may allow tracking ADC 100 to operate at a higher clock frequency than would otherwise be possible without the modifications to the voltage of the feedback signal.

Counter circuit 106 in the embodiment shown is an up/down counter that may increment or decrement based on the samples received from comparison circuit 108. The count value may also be provided to circuits downstream which may used the information to carry out various functions. Since the feedback signals is generated in part on the input voltage, the count value may thus reflect the value of the input voltage.

Figure 2:
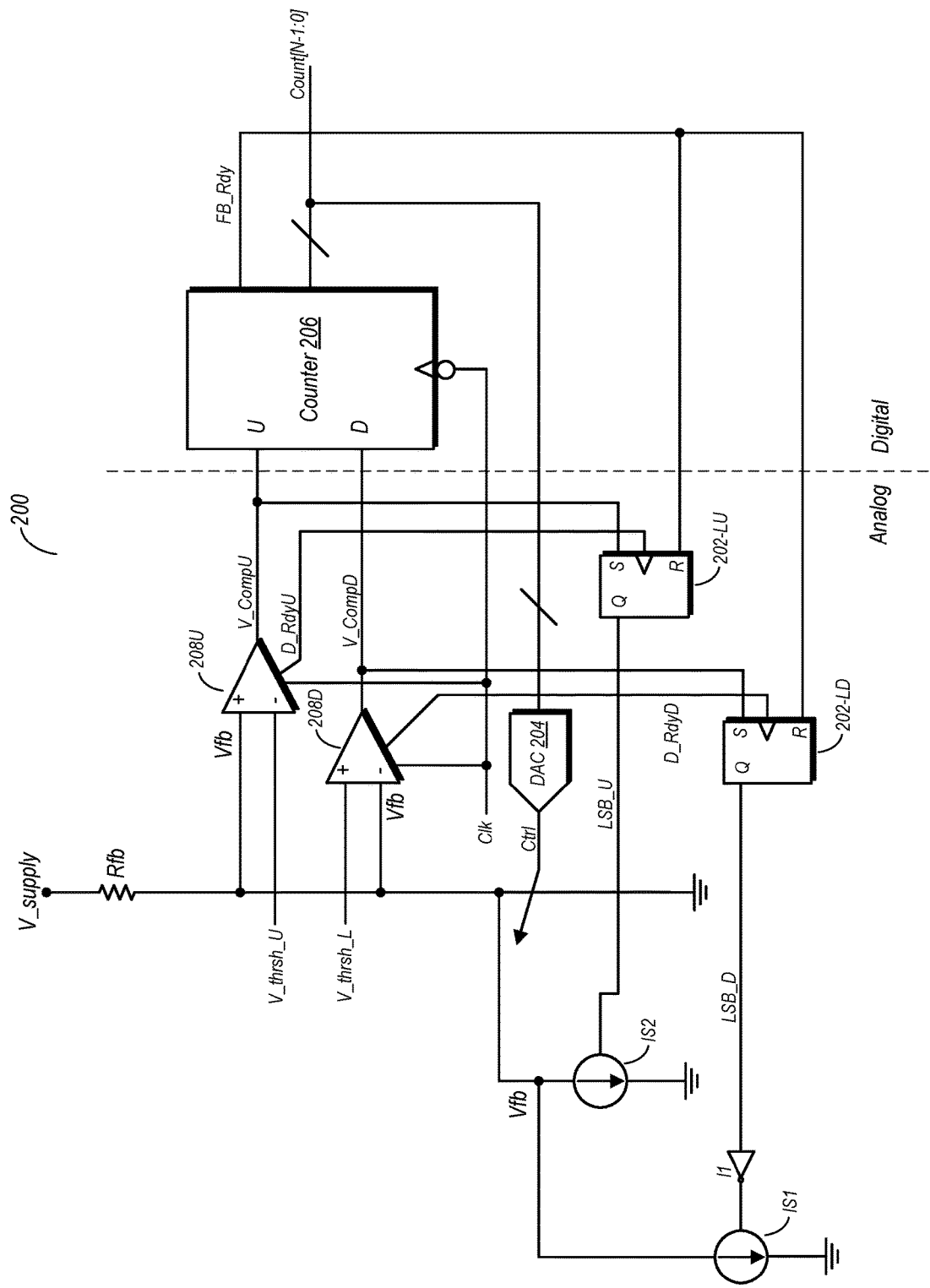
FIG. 2 is a schematic diagram of one embodiment of a tracking ADC.

FIG. 2 is a diagram of another embodiment of a tracking ADC. In the embodiment shown, tracking ADC 200 includes comparison circuit that is implemented using comparators 208U and 208D, each of which may compare the voltage of the feedback signal, Vfb, to different threshold values. Comparator 208U as shown here is arranged to compare Vfb to an upper threshold, V_thresh_U, while comparator 208D is configured to compare Vfb to a lower threshold value, V_thresh_D. Both comparators 208U and 208D are configured here to operate in accordance with a clock signal, Clk, and to provide respective output signals in response to, e.g., a rising edge of the clock signal.

Counter 206 in the embodiment shown is an up/down counter, with a U input coupled to receive the V_CompU signal from comparator 208U, and a D input coupled to receive the V_CompD signal from comparator 208D. During a given clock cycle, only one of the comparators 208U and 208D assert a signal, and during some clock cycles, neither of these comparators do so. Accordingly, during a given clock cycle, and in response to a given sample of Vfb, counter 206 may increment (when V_CompU is asserted), decrement (when V_CompD is asserted), or maintain its value (when neither of the comparators 208U and 208D assert an output signal).

The feedback circuit in the embodiment shown includes a feedback resistor, Rfb, as well as current sources IS1-IS2, and latches 202-LU and 202-LD. Through these circuits, fine adjustments may be made to the feedback voltage Vfb. With regard to the fine adjustments, current sources IS1 and IS2 may modify the feedback voltage by an analog equivalent to one LSB, and may thus aid in anticipating the next count value. As previously discussed, these modifications of the feedback voltage may occur for an amount of time (e.g., until the counter provides an updated value) and thus affect the settling time of the feedback voltage Vfb. More particularly, the feedback voltage Vfb may be settled faster than it would otherwise occur in the absence of these current sources due to the inherent RC filter in the feedback loop. The operation is such that the feedback loop may be fully closed, by activating one of current sources IS1 or IS2, in instances when the count is to be incremented or decremented, prior to actually updating the count value. After the count value has been updated, the feedback loop may be reset to cause deactivation of IS1 or activation of IS2. This may occur on a cycle-by-cycle basis with regard to the clock signal, Clk. It is noted that in instances where the count is to be maintained at its present value, neither of current sources IS1 or IS2 are activated.

In addition to being sent downstream to other circuitry, counter 206 is also coupled to send the count value, Count [N−1:0] to DAC 204. The output of DAC 204 is an analog control signal, Ctrl, which add additional current to the voltage feedback node. The control signal may be used to provide coarse control of the feedback voltage Vfb. During an evaluation phase (prior to updating the count value), the value of the control signal is based on the most recent updated count value. The feedback circuitry discussed herein, in instances when the count value is to be incremented or decremented, provide fine grain adjustments that correspond to approximately or substantially one LSB.

The outputs of comparators 208U and 208D, V_CompU and V_CompD, respectively, are provided to SR latches 202-LU and 202-LD, respectively, in addition to being provided to counter 206. The output signals of latches 202-LU and 202-LD may be used to activate corresponding current sources. When the feedback voltage Vfb exceeds the upper threshold V_thrsh_U, comparator 208U asserts the V_CompU signal. Thereafter, when the clock signal, Clk, toggle (e.g., from low to high), comparator 208U asserts the D_RdyU signal, which is applied to the clock input of latch 202-LU. Responsive to the assertion of V_CompU and D_RdyU, latch 202-LU asserts the LSB_U signal, which in turn causes activation of current source IS2. When active, current source IS2 may inject current onto the node carrying the Vfb signal in an amount sufficient to allow the feedback voltage to drop by an amount equivalent to one LSB. In this embodiment, LSB_U may remain asserted until the clock signal changes states again. Thereafter, counter 206, in addition to incrementing the count value by one LSB, also asserts the FB_Rdy signal, which is applied to the reset input of latch 202-LU. As a result of this reset signal, LSB_U is de-asserted and current source IS2 is deactivated.

Similar operation occurs when the feedback voltage Vfb is less than V_thresh_L, causing deactivation of V_CompD. When D_RdyD is asserted in response to the clock signal transition, latch 202-LD asserts LSB_D, thereby causing (via inverter I1) deactivation of current source IS1. When IS1 is deactivated, current is reduced on the feedback voltage node to allow Vfb to rise by an analog equivalent of one LSB. After the clock signal transitions again, updating the count value in counter 206, the FB_Rdy signal is again asserted, resetting latch 202-LD and thus causing deactivation of IS1.

Figure 3:
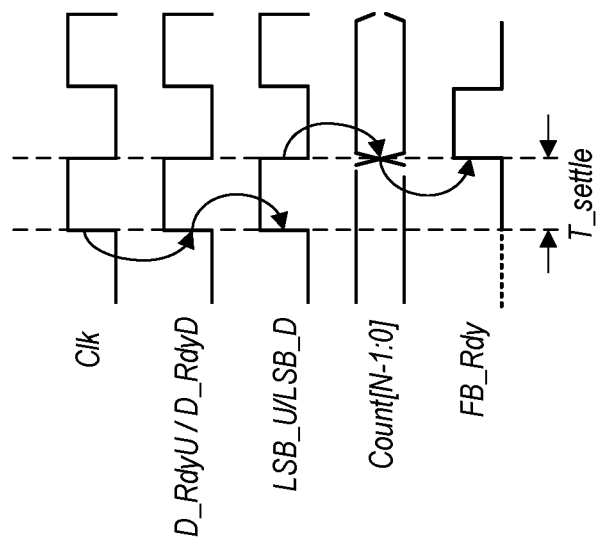
FIG. 3 is a timing diagram illustrating operation of one embodiment of a tracking ADC.

FIG. 3 is a timing diagram illustrating operation of the embodiment of tracking ADC 200 as shown in FIG. 2. This timing diagram assumes that one of the comparators triggers its respective output based on a comparison of the feedback voltage to its respectively received threshold.

During operation shown in FIG. 3, one of the comparators detects that the feedback voltage is not within limits, either exceeding the upper threshold or falling below the lower threshold. Upon the transition of the clock signal, the corresponding one of V_CompU/D is triggered, as is the corresponding D_RdyU/D signal from the same comparator. As a result, the corresponding one of LSB_U/LSB_D is asserted, and a corresponding modification is made to the voltage of the feedback signal (e.g., by activating a corresponding one of the current sources as shown in FIG. 2). D_RdyU/D may remain asserted until the falling edge of the clock cycle.

On the falling edge of the clock cycle, the count value (Count[N−1:0]) may be incremented or decremented, and the FB_Rdy signal is asserted. As a result of this assertion, the feedback circuit is reset by a corresponding one of the latches that had asserted its respective LSB_U/LSB_D signal. This causes deactivation of current source IS2 (if the up comparator asserted the V_CompU signal) or activation of current source IS1 (if the down comparator asserted the V_CompD signal). The time between the initial activation/deactivation of the current source and its deactivation/activation is shown here at T_Settle, which is the settling time resulting from the operation described herein. In addition, concurrent with the incrementing of the counter, the comparator that asserted its V_CompU/V_CompD signal de-asserts its corresponding D_RdyU/D_RdyD signal to cause its correspondingly coupled latch to reset.

Although only a single clock signal is shown, it is noted that there may be two clock signals in some embodiments. In one embodiment, the clock signal shown is provided to the counter, while another clock signal at a lower frequency is provided to the comparators. The clock signal provided to the counter may, in one embodiment, be generated by a clock multiplier configured to receive the clock signal that is provided to the comparators. Additionally, FIG. 3 is directed to the case in which one of the comparators asserts its output signal, which occurs when the feedback voltage Vfb is either greater than the upper threshold or less than the lower threshold. If the feedback voltage is between these two thresholds, the D_RdyU/D_RdyD signals and corresponding LSB_U/LSB_D signals are not asserted, and the counter is not incremented.

Figure 4:
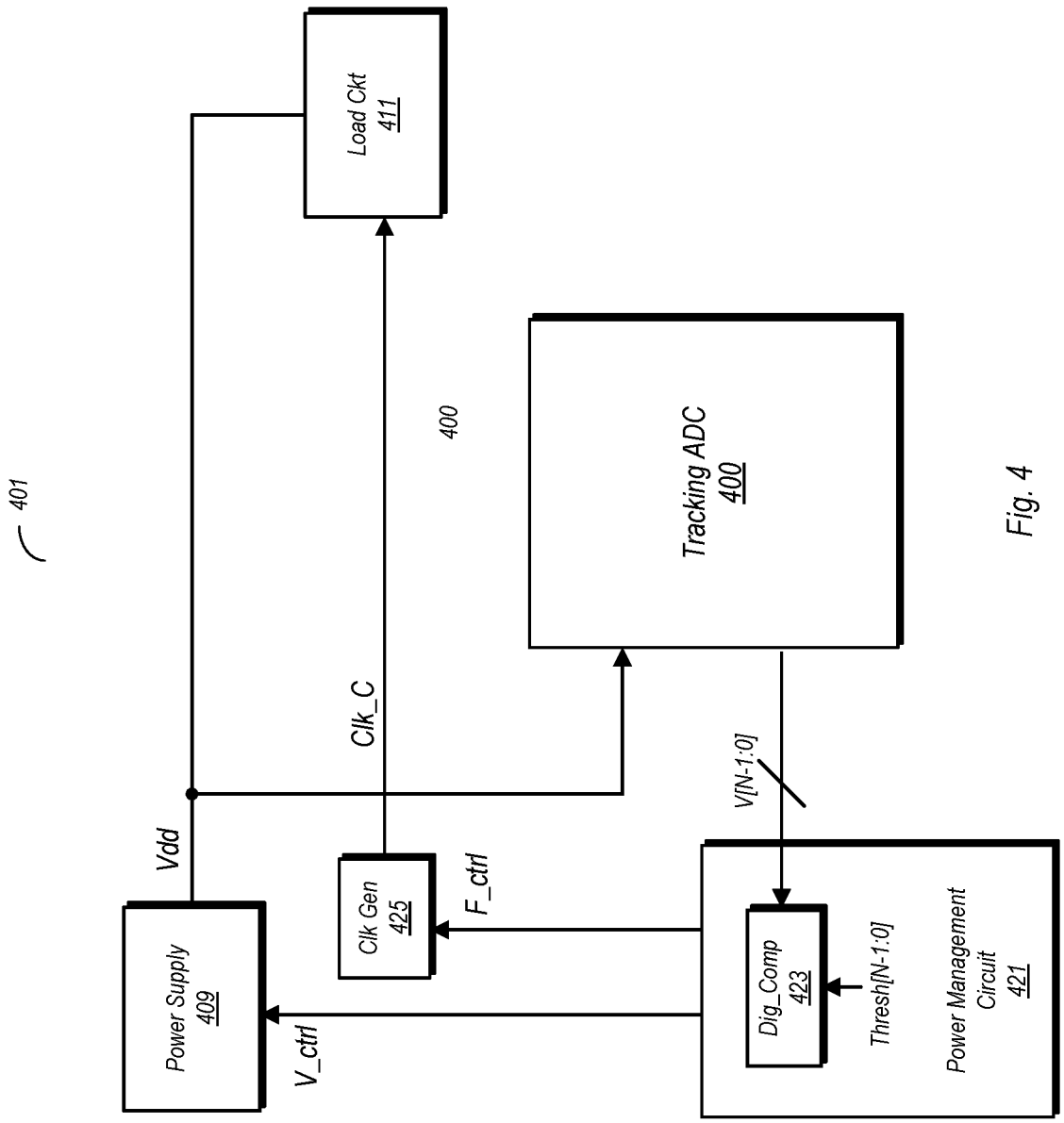
FIG. 4 is a block diagram of one embodiment of a system utilizing a tracking ADC for FIG. 5 is a flow diagram of one embodiment of a method for operating a tracking ADC.

System with Tracking ADC Voltage Monitoring Circuit and Power Management Circuit:

FIG. 4 is a block diagram illustrating one embodiment of a system utilizing a tracking ADC as a voltage monitoring circuit. In the embodiment shown, system 401 includes a power supply 409 coupled to provide a supply voltage, Vdd, to a load circuit 411. Power supply 409 may be one of a number of different types of power converters, such as a buck converter, boost converter, low dropout (LDO) voltage regulator, and so on. Power supply 409 can also be a battery, a wall outlet adapter, or other type. Load circuit 411 is also coupled to receive a clock signal, Clk_C, from clock generator 425. The Clk_C signal may be used to synchronize operations in load circuit 411.

Tracking ADC 400 in the embodiment shown may be any tracking ADC that falls within the scope of this disclosure, and may include a feedback circuit that allows for modification of the feedback voltage by an amount equivalent to one LSB during an evaluation time. The input voltage to tracking ADC 400 here is the supply voltage Vdd, and thus a voltage monitoring function is provided. Tracking ADC 400 is configured to convert the supply voltage into a digital value, V[N−1:0], which is then provided to a digital comparator 423 in power management circuit 421. The digital comparator 423 may compare the count value to one or more thresholds that are also provided as digital words. Thus, digital comparator 423 may determine if the supply voltage Vdd is within limits, in an overvoltage condition, or an undervoltage condition.

Power management circuit in the embodiment shown is configured to generate voltage and frequency control signals, V_ctrl (provided to power supply 409) and F_ctrl (provided to clock generator 425). These signals may be used to control the supply voltage and power consumption by load circuit 411 to enable response to an overvoltage or undervoltage condition. For example, in response to an undervoltage condition, power management circuit 421 may cause a reduction to the frequency of Clk_C for at least an amount of time sufficient to allow Vdd to be recovered to within limits. Power management circuit 421 may also gate Clk_C in some cases.

With regard to power supply 409, power management circuit 421 may change the operation to reduce the supply voltage in response to an overvoltage condition. For example, if power supply 409 is a buck converter that operates in both pulse width modulation (PWM) and pulse frequency modulation (PFM) modes, power management circuit 421 may cause a reduction of pulse width or pulse frequency in response to an overvoltage condition.

Generally speaking, power management circuit 421 may be capable of carrying out a wide variety of control functions to ensure that the supply voltage Vdd stays within prescribed limits. Additionally, power management circuit 421 may also carry out thermal control functions to allow system 401 to remain within thermal control limits.

It is noted that while the circuits discussed above have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types. Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on. The use of memristors in certain circuit structures is also contemplated.

Figure 5:
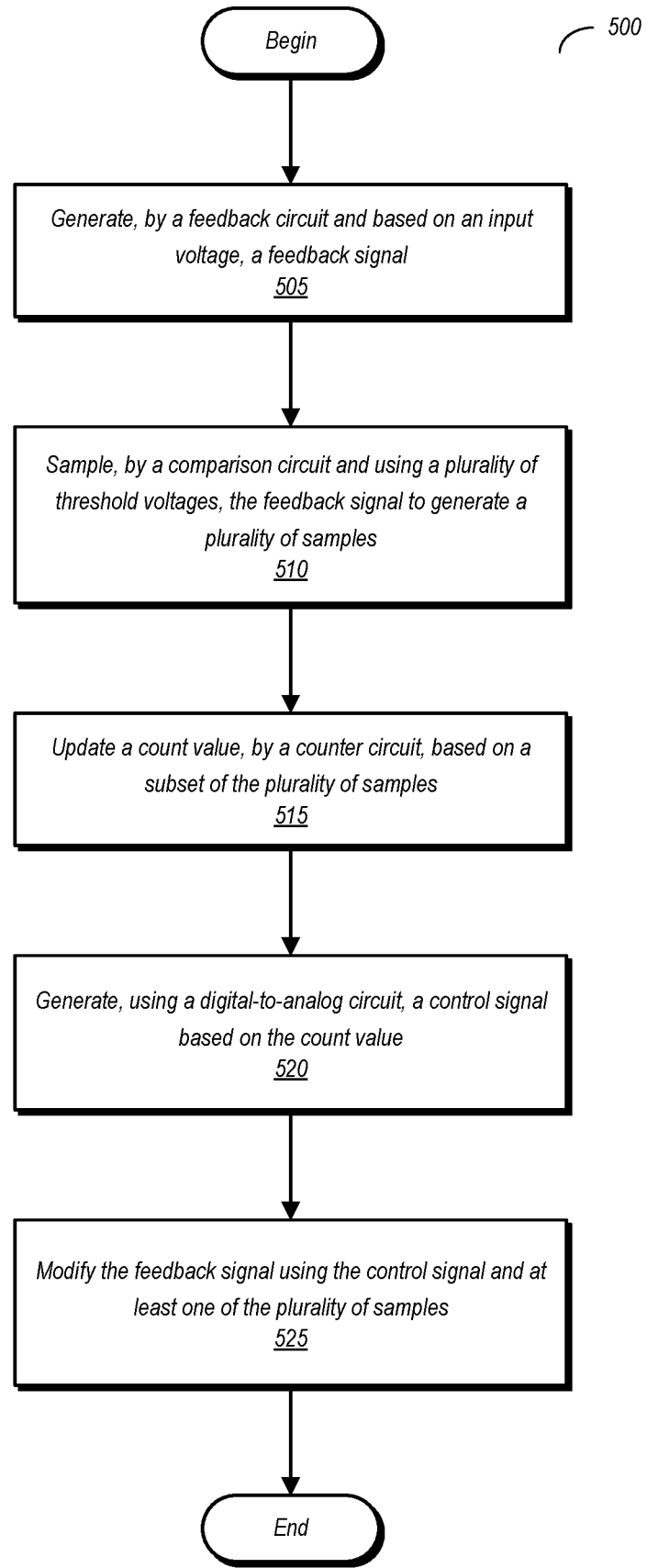

Methods of Operation:

FIG. 5 is a flow diagram of one embodiment of a method for operating a tracking ADC. Method 500 may be carried out by any of the tracking ADC embodiments discussed above. Furthermore, embodiments of a tracking ADC that are capable of carrying out Method 500, but not explicitly discussed herein or shown in the drawings, are also considered to fall within the scope of this disclosure.

Method 500 includes generating, by a feedback circuit and based on an input voltage, a feedback signal (block 505). The method further includes sampling, by a comparison circuit and using a plurality of threshold voltages, the feedback signal to generate a plurality of samples (block 510). The tracking ADC includes a counter circuit, and thus, Method 500 further includes updating a count value, by a counter circuit, based on a subset of the plurality of samples (block 515), and generating, using a digital-to-analog circuit, a control signal based on the count value (block 520). Method 500 further includes modifying the feedback signal using the control signal and at least one of the plurality of samples (block 525).

In various embodiments, the method includes generating a first comparison signal, using a first comparator circuit, in response to determining that a voltage of the feedback signal exceeds a first threshold, and activating a first current source to modify the feedback signal based on determining a voltage of the feedback signal exceeds the first threshold. The embodiment may also include a second comparator circuit, and thus the method may include generating a second comparison signal, using a second comparator circuit, in response to determining that the voltage of the feedback signal is less than a second threshold, wherein the second threshold is less than the first threshold, and activating a second current source to modify the feedback signal based on determining that the voltage of the feedback signal is less than the second threshold. In some cases, the voltage of the feedback signal may be greater than the second threshold and less than the first threshold. In such instance, embodiments of the method include inhibiting activation of the first and second current sources in response to the voltage of the feedback signal being less than the first threshold and greater than the second threshold.

With regard to the counter, embodiments of the method include incrementing the count value in response to the first comparator circuit asserting the first comparator signal, and decrementing the count value in response to the second comparator asserting the second comparator signal. The method may further include maintaining the count value in response to neither the first comparator circuit asserting the first comparator signal nor the second comparator asserting the second comparator signal.

While the feedback signal may be modified, the modification may not occur throughout the entirety of a cycle of a clock signal. Instead, the feedback signal may be modified for an amount of time commensurate with an amount of time that would be required for the feedback signal to settle due to the unintended RC filter that may be present. Accordingly, embodiments of a method for operating such a tracking ADC include modifying the feedback signal, during a first portion of a given clock cycle, using at least one of the plurality of samples and the control signal, and further include modifying the feedback signal, during a second portion of the given clock cycle, using the control signal exclusive of the feedback signal.

With regard to the particular modification of the feedback signal, embodiments of the method include modifying the feedback signal by a value corresponding to one least significant bit of the counter circuit. That is, the voltage change of the feedback signal may be substantially or approximately the same amount that, when applied to comparison circuitry, would cause the counter output to change by one least significant bit.

Figure 6:
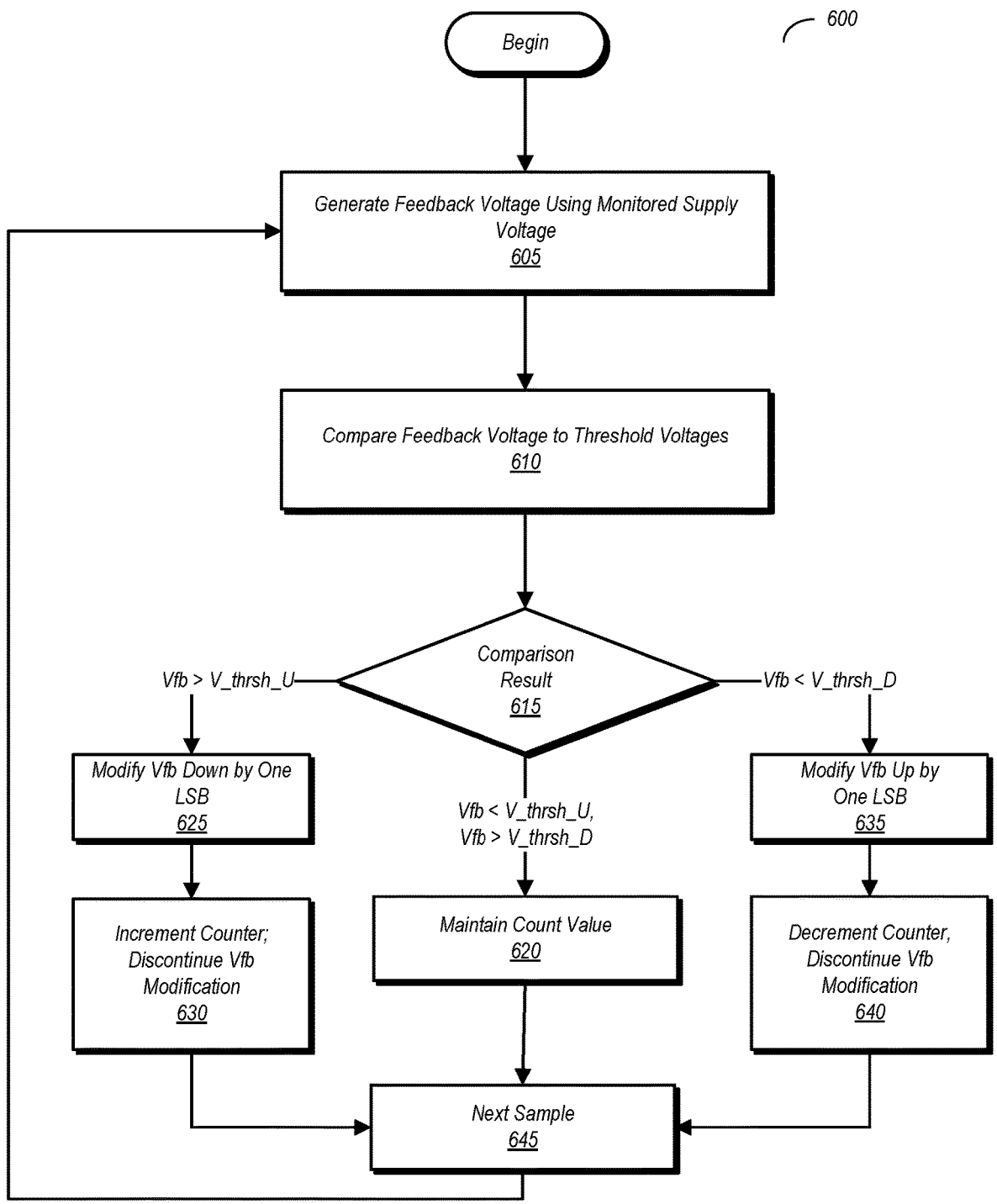
FIG. 6 is a flow diagram of another embodiment of a method for operating a tracking ADC.

FIG. 6 is a flow diagram of another embodiment of a method for operating a tracking ADC. Method 600 may be carried out by a tracking ADC such as that shown in FIG. 2, as well as other types of tracking ADCs that perform comparisons of a feedback voltage to two different thresholds and either increment, decrement, or maintain the count value for a given sample. Embodiments of a tracking ADC capable of carrying out Method 600 but not otherwise disclosed herein are considered to fall within the scope of this disclosure. The application of a tracking ADC in the embodiment of Method 600 as discussed herein is supply voltage monitoring, although method embodiments involving other use cases may also be considered to fall within the scope of this disclosure.

Method 600 includes generating a feedback voltage based on a monitored supply voltage (block 605). The feedback voltage is then compared to various threshold voltages (block 610). For example, the tracking ADC may include a first comparator circuit that compares the feedback voltage to a first threshold voltage, and a second comparator circuit that compares the feedback voltage to a second threshold voltage that is less than the first threshold voltage.

When two threshold voltages are used, three possible comparison results are possible. If the feedback voltage is less than the first threshold voltage but greater than the second threshold voltage (block 615, Vfb<V_thrsh_U, Vfb>V_thrsh_D), then the current count value is maintained by the counter circuit (block 620). That is, the counter is neither incremented or decremented.

If the feedback voltage is greater than the first threshold voltage (block 615, Vfb>V_thrsh_U), a feedback circuit of the tracking ADC may modify Vfb downward by an amount approximately or substantially equivalent to on LSB (block 625). In one embodiment, this may be carried out by injecting current into the same node of the circuit upon which the feedback voltage is conveyed. Additionally, in response to the comparison result, the counter is incremented and, after a certain amount of time, the modification of the feedback voltage is discontinued (block 630). In one embodiment, this amount of time may be after a sufficient amount of time has elapsed to ensure that the settling of the voltage of the feedback voltage.

If the feedback voltage is less than the second threshold voltage (block 615, Vfb<V_thrsh_D), the feedback circuit of the tracking ADC may modify Vfb upward by one LSB (block 635). Thereafter, the count value from the counter circuit is decremented, and the modification of Vfb may be discontinued after sufficient time has elapsed.

Irrespective of the path taken from block 615, Method 600, after incrementing, decrementing, or maintaining the count value for a given sample, the method may progress to a next sample (block 645) and return to block 605.

Figure 7:
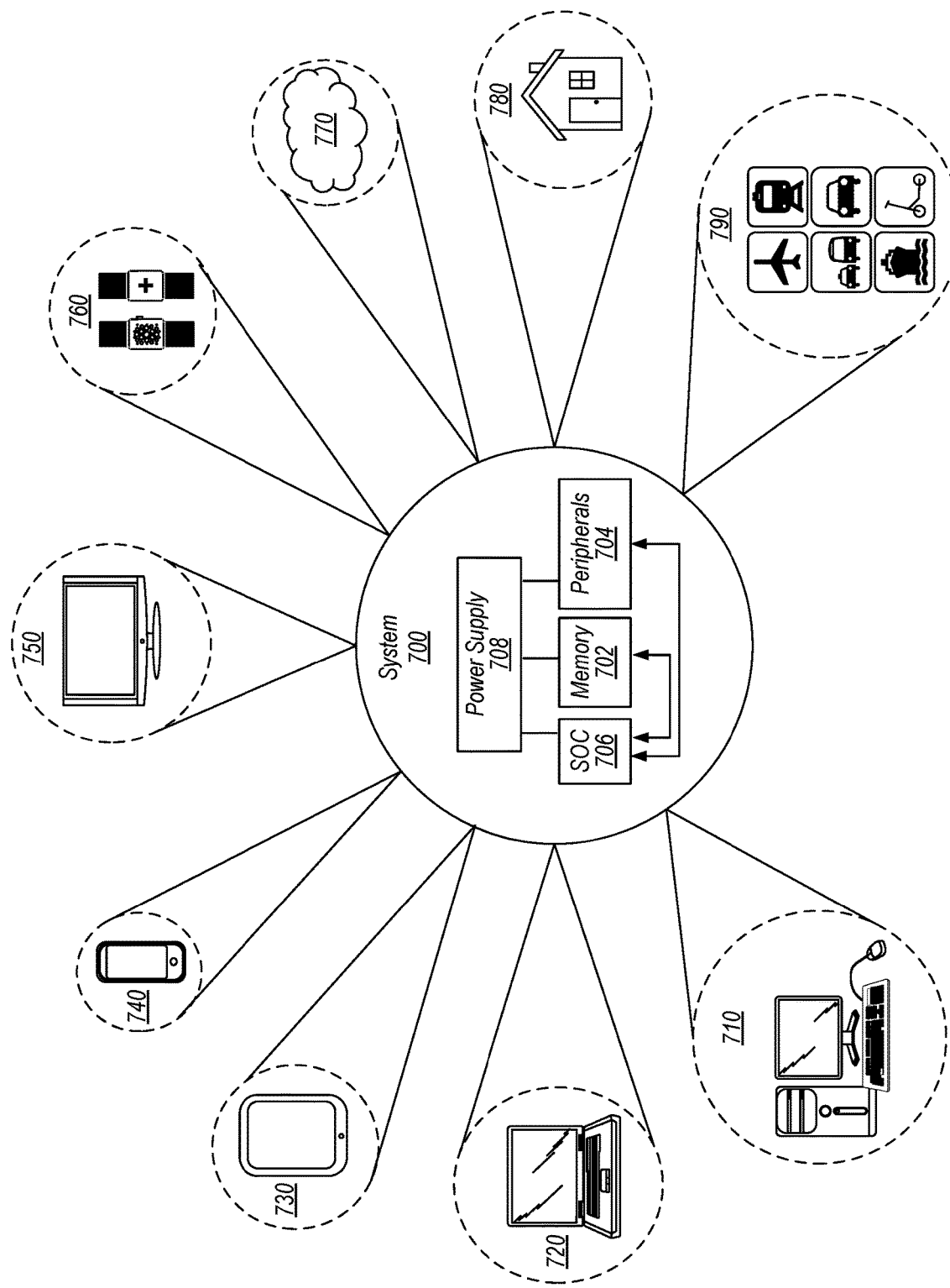
FIG. 7 is a block diagram of one embodiment of an example system.

Example System:

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices. In some embodiments, one or more processors in SoC 706 includes multiple execution lanes and an instruction issue queue. In various embodiments, SoC 706 is coupled to external memory 702, peripherals 704, and power supply 708.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 706 in the embodiment shown, as well various integrated circuits that may be included in ones of the peripherals 704, may include one or more instances of a tracking ADC as described herein. For example, SoC 706 may include a power management circuit configured to managed the power provided to various functional circuit blocks, and may thus also include various instances of a tracking ADC to monitor voltage levels of power converters that provide a supply voltage to these functional circuit blocks.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch 760 may include a variety of general-purpose computing related functions. For example, smartwatch 760 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a feedback circuit configured to generate a feedback signal using an input voltage;
   a comparison circuit configured to sample, using a plurality of threshold values, the feedback signal to generate a plurality of samples;
   a counter circuit configured to update a count value using a subset of the plurality of samples; and
   a digital-to-analog converter (DAC) circuit configured to generate a control signal using the count value;
   wherein the feedback circuit is further configured to modify the feedback signal using the control signal and at least one of the plurality of samples.

2. The apparatus of claim 1, wherein the comparison circuit includes:
   a first comparator configured generate a first comparison signal based on a voltage of the feedback signal exceeding a first threshold voltage;
   a second comparator configured to generate a second comparison signal based on the voltage of the feedback signal being less than a second threshold voltage, wherein the second threshold voltage is less than the first threshold voltage.

3. The apparatus of claim 2, wherein the counter circuit is configured to increment the count value in response to assertion of the first comparison signal and further configured to decrement the count value in response to assertion of the second comparison signal.

4. The apparatus of claim 2, wherein the feedback circuit includes:
   a first current source configured to modify the feedback signal using a first current in response to the first comparator asserting the first comparison signal; and
   a second current source configured to modify the feedback signal using a second current in response to the second comparator asserting the second comparison signal.

5. The apparatus of claim 4, further comprising:
   a first latch configured to activate the first current source in response to the first comparator asserting the first comparison signal; and
   a second latch configured to activate the second current source in response to the second comparator asserting the second comparison signal.

6. The apparatus of claim 5, wherein the counter circuit is configured to cause a reset of the first and second latches at a time subsequent an assertion of one of the first and second comparison signals.

7. The apparatus of claim 4, wherein the feedback circuit is configured to inhibit activation of either of the first and second current sources in response to neither the first comparator asserting the first comparison signal nor the second comparator asserting the second comparison signal.

8. The apparatus of claim 2, wherein the counter circuit is configured to maintain a current count value in response to neither the first comparator asserting the first comparison signal nor the second comparator asserting the second comparison signal.

9. The apparatus of claim 1, wherein, during a first portion of time, the feedback circuit is configured to modify the feedback signal by a value corresponding to one least significant bit of the counter circuit using the control signal and one of the plurality of samples.

10. The apparatus of claim 8, wherein, during a second portion of time, the DAC circuit is configured to modify the feedback signal exclusive of the feedback circuit.

11. A method comprising:
    generating, by a feedback circuit and based on an input voltage, a feedback signal;
    sampling, by a comparison circuit and using a plurality of threshold voltages, the feedback signal to generate a plurality of samples;
    updating a count value, by a counter circuit, based on a subset of the plurality of samples;
    generating, using a digital-to-analog circuit, a control signal based on the count value; and
    modifying the feedback signal using the control signal and at least one of the plurality of samples.

12. The method of claim 11, further comprising:
    generating a first comparison signal, using a first comparator circuit, in response to determining that a voltage of the feedback signal exceeds a first threshold;
    activating a first current source to modify the feedback signal based on determining a voltage of the feedback signal exceeds the first threshold;
    generating a second comparison signal, using a second comparator circuit, in response to determining that the voltage of the feedback signal is less than a second threshold, wherein the second threshold is less than the first threshold;
    activating a second current source to modify the feedback signal based on determining that the voltage of the feedback signal is less than the second threshold; and
    inhibiting activation of the first and second current sources in response to the voltage of the feedback signal being less than the first threshold and greater than the second threshold.

13. The method of claim 12, further comprising:
    incrementing the count value in response to the first comparator circuit asserting the first comparator signal;
    decrementing the count value in response to the second comparator circuit asserting the second comparator signal; and
    maintaining the count value in response to neither the first comparator circuit asserting the first comparator signal nor the second comparator circuit asserting the second comparator signal.

14. The method of claim 12, further comprising:
    modifying the feedback signal, during a first portion of a given clock cycle, using at least one of the plurality of samples and the control signal; and
    modifying the feedback signal, during a second portion of the given clock cycle, using the control signal exclusive of the feedback signal.

15. The method of claim 11, further comprising modifying the feedback signal by a value corresponding to one least significant bit of the counter circuit.

16. A system comprising:
- a power converter configured to generate a supply voltage;
- a voltage monitoring circuit configured to monitor a level of the supply voltage, wherein the voltage monitoring circuit comprises a tracking analog-to-digital converter (ADC) circuit including:
  - a comparison circuit configured to generate a plurality of samples by comparing a feedback voltage to ones of a plurality of threshold values;
  - a feedback circuit configured to generate and modify a feedback voltage, wherein the feedback voltage is based on the supply voltage;
  - a counter circuit configured to generate a count values based on ones of the plurality of samples provided by the comparison circuit, wherein a particular one of the count values is indicative of a current value of the supply voltage; and
  - a digital-to-analog converter (DAC) circuit configured to generate a control signal, using ones of the count values, to modify the feedback voltage; and
- a power management circuit coupled to receive count values from the tracking ADC, wherein the power management circuit is configured to perform one or more power control actions based on the count values.

17. The system of claim 16, wherein the feedback circuit includes:
- a first current source configured to modify the feedback voltage using a first current in response to the comparison circuit asserting a first comparison signal;
- a second current source configured to modify the feedback voltage using a second current in response to the comparison circuit asserting a second comparison signal;
- wherein the comparison circuit is configured to assert the first comparison signal in response to the feedback voltage being greater than a first threshold, assert the second comparison signal in response to the feedback voltage being less than a second threshold, the second threshold being less than the first threshold, and further configured to assert neither the first nor the second comparison signals if the feedback voltage is between the first and second thresholds.

18. The system of claim 17, wherein the counter circuit is configured to:
- increment a current count value in response to the comparison circuit asserting a first comparison signal;
- decrement the current count value in response to the comparison circuit asserting a second comparison signal; and
- maintain the current count value in response to the comparison circuit asserting neither of the first and second comparison signals.

19. The system of claim 17, wherein the feedback circuit further includes:
- a first latch configured to activate the first current source in response to the comparison circuit asserting the first comparison signal during a first portion of a clock cycle; and
- a second latch configured to activate the second current source in response to the comparison circuit asserting the second comparison signal during the first portion of the clock cycle;
- wherein the first and second latches are configured to cause deactivation of a corresponding active one of the first and second current sources during a second portion of the clock cycle.

20. The system of claim 16, wherein the power management circuit is configured to compare count values received from the counter circuit to digital values corresponding to one or more supply voltage values and is further configured to perform the one or more power control actions in response to determining that the supply voltage is not within a specified range.

* * * * *